(12) United States Patent
Sukegawa et al.

(10) Patent No.: US 7,464,259 B2
(45) Date of Patent: Dec. 9, 2008

(54) MICROPROCESSOR BOOT-UP CONTROLLER, NONVOLATILE MEMORY CONTROLLER, AND INFORMATION PROCESSING SYSTEM

(75) Inventors: Hiroshi Sukegawa, Tokyo (JP); Kenji Sakaue, Kanagawa (JP); Hitoshi Tsunoda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 11/084,039

(22) Filed: Mar. 21, 2005

(65) Prior Publication Data

US 2005/0223211 A1 Oct. 6, 2005

(30) Foreign Application Priority Data

Mar. 24, 2004 (JP) ............................ 2004-086737

(51) Int. Cl.
*G06F 9/00* (2006.01)
(52) U.S. Cl. .............................................. 713/2; 713/1
(58) Field of Classification Search .................... 713/1, 713/2
See application file for complete search history.

(56) References Cited

U.S. PATENT DOCUMENTS

| | | | |
|---|---|---|---|
| 5,455,918 A * | 10/1995 | Fowler et al. ................... 710/5 |
| 5,809,531 A * | 9/1998 | Brabandt ..................... 711/141 |
| 6,185,134 B1 * | 2/2001 | Tanaka ................... 365/185.33 |
| 6,216,224 B1 * | 4/2001 | Klein ............................. 713/1 |
| 6,263,399 B1 * | 7/2001 | Hwang ........................ 711/103 |
| 6,356,965 B1 | 3/2002 | Broyles et al. |
| 6,601,167 B1 * | 7/2003 | Gibson et al. .................. 713/2 |
| 7,000,846 B2 * | 2/2006 | Hakushi et al. ............. 235/492 |
| 7,082,525 B2 * | 7/2006 | Hutton et al. ................... 713/2 |
| 7,165,137 B2 * | 1/2007 | Chang et al. ................. 711/102 |
| 7,234,049 B2 * | 6/2007 | Choi et al. ...................... 713/1 |
| 7,234,052 B2 * | 6/2007 | Lee et al. ........................ 713/2 |
| 7,340,566 B2 * | 3/2008 | Voth et al. ................... 711/137 |

\* cited by examiner

*Primary Examiner*—Thomas Lee
*Assistant Examiner*—Vincent T Tran
(74) *Attorney, Agent, or Firm*—Oblon, Spivak, McClelland, Maier & Neustadt, P.C.

(57) ABSTRACT

A processor boot-up controller includes: a volatile memory connected to a nonvolatile memory; a selector, which transfers boot-up codes to the volatile memory from the nonvolatile memory; a controller for the nonvolatile memory configured from a boot-up control sequencer, which transmits CPU read-in data to the CPU and brings the CPU into a wait state until boot-up code transfer completes; and an error detection and correction unit connected to the external CPU and the nonvolatile memory. The processor boot-up controls the CPU by reading data from the nonvolatile memory. The processor enables the CPU to access a SRAM in the shortest time in sync with the SRAM's ready timing, resulting in a reduction of average system boot-up time. An information processing system can use the controller for example for a nonvolatile memory, a microprocessor boot-up controller, and multi-valued nonvolatile memory.

2 Claims, 8 Drawing Sheets

MICROPROCESSOR BOOT-UP CONTROLLER, NONVOLATILE MEMORY CONTROLLER, AND INFORMATION PROCESSING SYSTEM

CROSS REFERRENCE TO RELATED APPLICATIONS AND INCORPORATION BY REFERENCE

This application is based upon and claims the benefit of prior Japanese Patent Application P2004-086737 filed on Mar. 24, 2004; the entire contents of which are incorporated by reference herein.

BACKGROUND OF THE INVENTION

1. Field of the Invention

The present invention relates to a microprocessor boot-up controller and a nonvolatile memory controller. It also relates to an information processing system using a microprocessor boot-up controller and a nonvolatile memory.

2. Description of the Related Art

A system in which a nonvolatile memory (e.g., NAND flash memory) is used as a boot read-only memory (boot ROM) permits a host central processing unit (CPU) to access a SRAM as a boot ROM after transfer of NAND read data to the static random access memory (SRAM).

On the other hand, an access to SRAM from the host CPU must be disabled by bringing the host CPU into a wait state until the SRAM enters a read ready state after loading data to the SRAM from the NAND nonvolatile memory. The related art includes a mechanism for generating and providing a power-on reset signal to a boot controller and a CPU, and canceling the power-on reset signal to the CPU when a SRAM in the boot controller enters an access ready state.

A boot system using NAND flash memory and a booting method for the same have been disclosed (e.g., Japanese Patent Application Laid-Open No. 2003-271391). In addition, a nonvolatile semiconductor memory device, which writes system boot data in an arbitrary address of a NAND flash memory used as file memory, for example, has also been disclosed (e.g., Japanese Patent Application Laid-Open No. 2003-162453). Furthermore, boot codes and a NAND flash memory have been disclosed (e.g., Japanese Patent Application Laid-Open No. 2003-114826 and U.S. Pat. No. 5,519,843). In addition, a configuration of a multi-valued NAND cell has been disclosed (e.g., Japanese Patent Application Laid-Open No. 2002-313089).

When using multi-valued NAND nonvolatile memory as the boot ROM, there is a problem that the multi-valued NAND nonvolatile memory tends to cause a change in data due to a slight threshold voltage variation, which may be due to age deterioration in a data holding circuit, more easily than a two-valued NAND nonvolatile memory, and thus is less reliable. Therefore, it is difficult to provide a nearly error-free highly reliable boot system.

On the other hand, a problem of generating and providing a power-on reset signal to a boot controller and a CPU, and canceling the power-on reset signal to the CPU when a SRAM in the boot controller enters an access ready state is complexity of a power-on reset circuit. The availability of the SRAM varies due to capacity of the program to be loaded in the SRAM, retry due to an erroneous NAND read-in data, error correction or the like. Therefore, a CPU reset must always be cancelled in a worst-case timing. Accordingly, CPU reset cannot be cancelled in the shortest time in sync with the time when the SRAM becomes ready, creating a problem in that average system boot-up time cannot be reduced.

SUMMARY OF THE INVENTION

An aspect of the present invention inheres in a microprocessor boot-up controller connected to a CPU and a nonvolatile semiconductor memory and which reads data from the nonvolatile memory and controls boot-up of the CPU; the microprocessor boot-up controller includes: volatile memory connected to the nonvolatile memory and to which a boot-up program code is transferred from the nonvolatile memory; and a boot-up control sequencer configured to transmit CPU read-in data to the CPU, so as to bring the CPU into a wait state until transfer of the boot-up program code is completed.

Another aspect of the present invention inheres In a nonvolatile semiconductor memory controller, that includes: a plurality of word lines; and a plurality of memory cells, each connected to a corresponding one of the word lines and each having N threshold voltages, where N is a natural number of 4 or greater.

The plurality of memory cells constitutes a plurality of pages, the same data is written in each of the pages when writing in the nonvolatile memory, and only part of the pages to which the same data is written is accessed when reading out the nonvolatile memory.

Another aspect of the present invention inheres in an information processing system, which includes: a multi-valued NAND nonvolatile memory including a plurality of word lines and a plurality of memory cells connected to the respective word lines, each having a plurality of threshold voltages, and that is divided into a first and a second storage area. A program code is stored in the first storage area and user data is stored in the second storage area; a volatile memory to which the program code is transferred from the multi-valued NAND nonvolatile memory; and a CPU connected to the volatile memory and configured to operate based on the program code transferred to the volatile memory.

BRIEF DESCRIPTION OF DRAWINGS

FIG. 5 is a schematic diagram describing a configuration of odd and even pages of page units in the multi-valued NAND nonvolatile memory used for the second embodiment of the present invention;

DETAILED DESCRIPTION OF THE INVENTION

Figure 1:
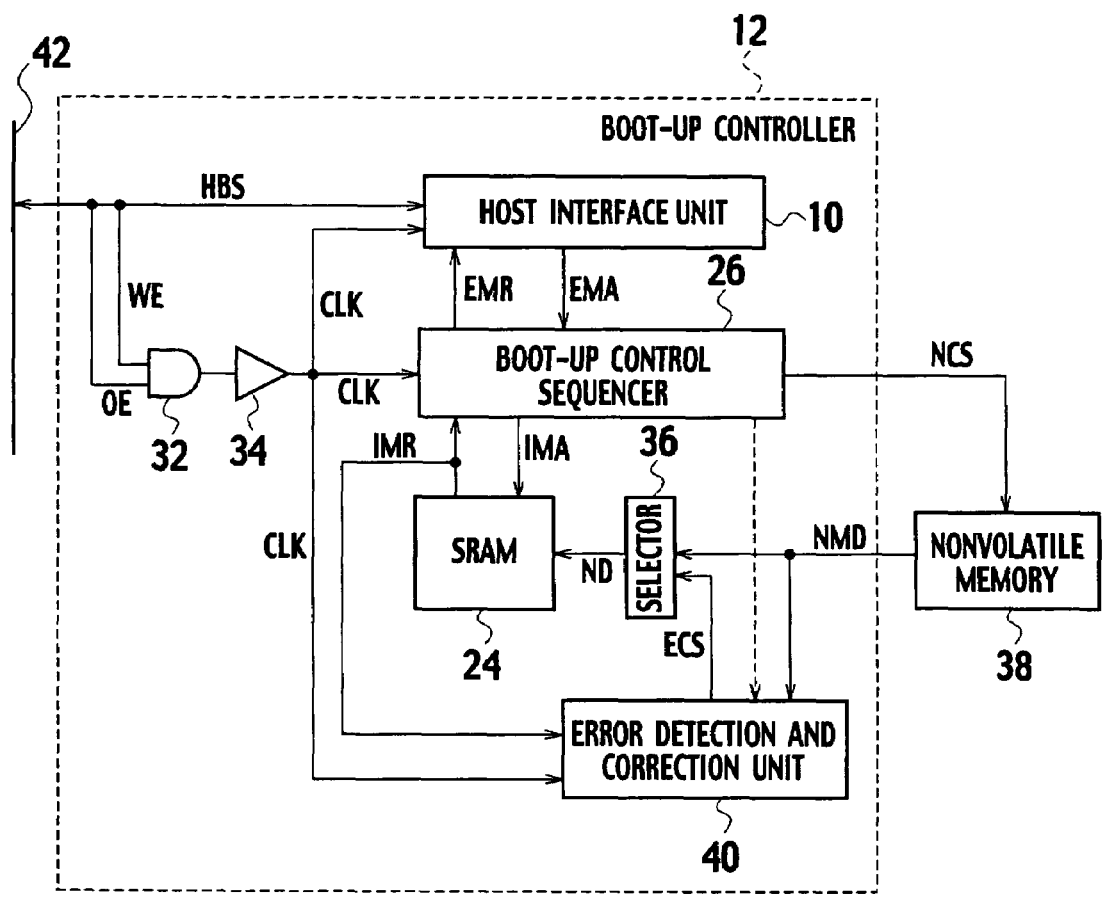
FIG. 1 is a schematic block diagram of a microprocessor boot-up controller, according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Next, the embodiments of the present invention are described forthwith while referencing the drawings. The embodiments given with exemplified devices and methods for embodying the technical ideas of the present invention, and those technical ideas of the present invention are not limited to the following embodiments. The technical ideas of the present invention may be modified into various modifications within the scope of the appended claims.

According to the embodiments of the present invention, a microprocessor boot-up controller, which is capable of enabling the CPU to access a volatile memory in sync with when the volatile memory becomes ready, and shortening average system boot-up time, can be provided. In addition, a highly reliable nonvolatile memory controller, which can resolve problems developed when using multi-valued NAND nonvolatile memory as boot ROM, and a multi-functional information processing system for user applications, can be provided.

Next, the first through the fifth embodiment of the present invention are described forthwith while referencing the drawings. However, it should be noted that the drawings are merely schematics that the ratio of sizes of respective blocks differ from exact dimensions according to the present invention. Furthermore, needless to say that parts of respective blocks with differing dimensions and/or differing ratios may be included among the drawings.

First Embodiment

As shown in FIG. 1, a microprocessor boot-up controller 12, according to the first embodiment of the present invention, is connected to an external CPU and nonvolatile memory 38, and reads in data from the nonvolatile memory 38 and then controls boot-up of the CPU. The microprocessor boot-up controller 12 includes: volatile memory (SRAM) 24 connected to the nonvolatile memory 38; a selector 36, which transfers boot-up codes to the SRAM 24 from the nonvolatile memory 38; and a boot-up control sequencer 26, which transmits CPU read-in data to the CPU, and then brings the CPU into a wait state until the boot-up code transfer is completed.

Here, the CPU read-in data is a CPU instruction code. In addition, the CPU instruction code is either a no-operation instruction (NOP), an arithmetic and logic operation instruction, a data transfer instruction, a branch instruction, or an input/output instruction for a peripheral device. The CPU read-in data can be determined regardless of the CPU output address.

In addition, as shown in FIG. 1, the microprocessor boot-up controller 12, according to the first embodiment of the present invention, may include a host interface unit 10, which reads in a branch instruction into the CPU regardless of CPU output address after completion of the boot-up code transfer to the SRAM 24 from the nonvolatile memory 38. An external memory address signal EMA is provided to the boot-up control sequencer 26 from the host interface unit 10. On the other hand, an external memory read data signal EMR is provided to the host interface unit 10 from the boot-up control sequencer 26.

After completion of the boot-up code transfer to the SRAM 24 from the nonvolatile memory 38, once a branch instruction is read into the CPU regardless of CPU output address, data for the CPU output address is read into the CPU. An AND gate 32 and a buffer circuit 34 are used to generate, from a host CPU bus signal HBS, a clock signal CLK, which drives a means for allowing the CPU to read in data for the CPU output address.

The present invention avoids the necessity of a clock generation circuit in the boot-up controller 12 because of the host bus signal HBS (a write enable signal WE and an output enable signal OE) provided to the AND gate 32.

In this case, the host CPU bus signal HBS is transferred between the host CPU bus 42, which connects an external CPU, and the host interface unit 10. A write enable signal WE and an output enable signal OE branch off from the host CPU bus signal HBS, and then enter the AND gate 32. The clock signal CLK, which is an output signal from the buffer circuit 34, is provided to the host interface unit 10, the boot-up control sequencer 26, and an error detection and correction unit 40.

In addition, as shown in FIG. 1, the microprocessor boot-up controller 12, according to the first embodiment, includes the error detection and correction unit 40, which detects whether or not there is erroneous data loaded into the SRAM 12 and then corrects an error if it is detected. The nonvolatile memory 38 stores the same boot-up program set in multiple blocks, and the error correction and detection unit 40 carries out an error correction if erroneous data is detected in a data loaded into the SRAM 12. If it cannot correct that error, it selects another set of boot-up program one after another from the boot-up program sets, reloads the selected boot-up program set into the SRAM 24, and carries out error detection and correction.

Furthermore, the CPU instruction code may be either an arithmetic and logic operation instruction for a device unnecessary until a time of executing a boot-up code, an arithmetic and logic operation instruction for a device uninfluenced until a time of executing the boot-up code, an arithmetic and logic operation instruction for memory that is unnecessary until a time of executing the boot-up code has been completed, an arithmetic and logic operation instruction for memory uninfluenced until a time of executing the boot-up code has been completed, an arithmetic and logic instruction for a register that is unnecessary until a time of executing the boot-up code, an arithmetic and logic operation instruction for a register uninfluenced until a time of executing the boot-up code, a data transfer instruction for a device unnecessary until a time of executing the boot-up code, a data transfer instruction for a device uninfluenced until a time of executing the boot-up code, a data transfer instruction for memory that is unnecessary until a time of executing the boot-up code has been completed, a data transfer instruction for memory that is uninfluenced until a time of executing the boot-up code has been completed, a data transfer instruction for a register unnecessary until a time of executing the boot-up code, a data transfer instruction for a register uninfluenced until a time of executing the boot-up code, an input/output instruction for a peripheral device unnecessary until a time of executing the boot-up code has been completed, and an input/output instruction for a peripheral device that is uninfluenced until a time of executing the boot-up code has been completed.

Here, the above registers allow execution of a loop operation, which is insignificant for registers defined in a CPU instruction set, or execution of an effective NOP loop operation, and may be, for example, an accumulator register storing invalid data and allowing successive execution of an increment instruction.

Memory in this case means main memory configured by general purpose DRAM or general purpose SRAM.

Here, a peripheral device, peripheral equipment, and memory are all categorized as peripheral devices in a broad sense. The peripheral device is provided in the form of a board. The peripheral equipment is assumed as a set type of peripheral devices. For example, general-purpose memory (DRAM, SRAM), a video card, a USB interface, a PC card interface, and the like are categorized as the peripheral devices. A peripheral terminal apparatus, such as a monitor, a printer, a keyboard, and the like, are categorized as the peripheral equipment.

In addition, with the microprocessor boot-up controller 12, according to the first embodiment, an address to which a branch instruction points may be the start address of a boot-up code, or may be an address in the nonvolatile memory 38. Alternatively, once multiple boot-up program sets are stored in the nonvolatile memory 38, a boot-up program set may be selected based on an input pin status of the controller, and the selected boot-up program may be loaded into the SRAM 24.

Alternatively, with the microprocessor boot-up controller 12, according to the first embodiment, after completion of the boot-up code transfer to the SRAM 24 from the nonvolatile memory 38, units other than the CPU and microprocessor boot-up controller 12 may be reset, executing a boot-up code.

An address signal, a data bus signal, a write enable signal (WE), an output enable signal (OE), and other related signals are transferred to the host CPU bus 42, which configures the CPU bus interface. The host CPU bus 42 to which an external CPU is connected is connected to the host interface unit 10 and the AND gate 32 via the data bus, which is used to transfer the host CPU bus signal (HBS). A write enable signal (WE) and an output enable signal (OE) are provided to the AND gate 32.

The host CPU bus 42 is connected to the boot-up controller 12, which includes the SRAM 24 configuring the main memory, for example, and peripheral devices. The boot-up controller 12 for the nonvolatile memory 38 includes: the host-interface unit 10; the boot-up control sequencer 26 or a nonvolatile memory controller; the SRAM 24; and the error detection and correction unit 40. For example, units other than multi-valued NAND nonvolatile memory are integrated onto the same chip, providing a single chip LSI. The SRAM 24 stores a program loaded from the multi-valued nonvolatile memory 38. After the system is turned on and loading the NAND data into the SRAM 24 is completed, the CPU accesses the SRAM 24 to start booting up.

(Boot Up)

When the system is turned on, the host CPU and the boot-up controller 12 are power-on reset, starting operation after reset cancellation.

The CPU accesses the SRAM 24 in the boot-up controller 12 assuming it as a ROM, so as to run a boot program.

Afterwards, the boot-up controller 12 starts loading NAND data into the SRAM 24, and then continues to output a no-operation instruction (NOP) code to the CPU, regardless of CPU output address, during a first phase from the start to the end of loading the NAND data into the SRAM 24; during which the CPU effectively enters a wait state.

Next, the boot-up controller 12 outputs a jump instruction, regardless of CPU output address, in the second phase after completion of loading the NAND data into the SRAM 24.

Afterwards, the boot-up controller 12 outputs an instruction for a CPU output address in the third phase after outputting the jump instruction. Since a program counter is in a free-run state and continues to be incremented in the first phase, a CPU output address should be an invalid value. However, since that address is determined by execution of the jump instruction in the second phase, processing proceeds to a normal program execution routine.

(NAND Read Data Error Processing)

Next, NAND read data error processing is described forthwith.

Figure 3:
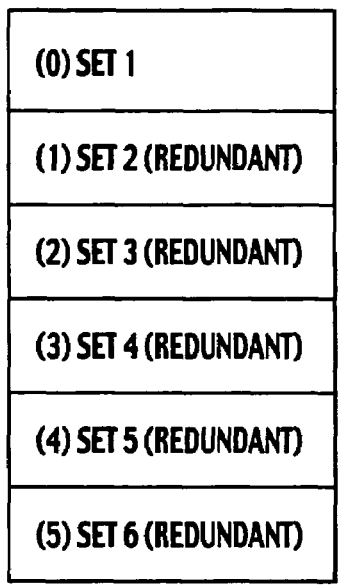
FIG. 3 is a schematic diagram describing multi-valued NAND boot code stored page addresses in multi-valued NAND nonvolatile memory used for the first and the second embodiment of the present invention.

As shown in FIG. 3, multi-valued NAND boot code stored page addresses in the multi-valued nonvolatile memory 38 used by the microprocessor boot-up controller 12, according to the first embodiment of the present invention, include six pages (0) to (5) in a NAND page address map, each having 528 bytes (a 512-byte data storage area plus a 16-byte redundant area).

In the boot-up controller 12, the error detection and correction unit 40 determines whether page 0 includes an error, while loading the 0 page into the SRAM 24, and if no errors are detected, data loading is completed; otherwise, if an error is detected, processing terminates abnormally. A boot code set is stored in page (0), and copies thereof are redundantly stored in pages (1) to (5). To begin with, the boot-up controller 12 shown in FIG. 1 loads, into the SRAM 24, set 1 of page (0) in the multi-valued NAND nonvolatile memory 38, while the error detection and correction unit 40 error checks concurrently.

If no errors are detected, loading is completed, and processing then proceeds to the above-mentioned second and the third phase. If an error is detected, the error detection and correction unit 40 stores a byte address in which the error is detected and error correction information. Furthermore, the error detection and correction unit 40 corrects, based on such information, data stored in the error detected address, which has been loaded into the SRAM 24, and completes loading. Processing then proceeds to the above-mentioned second and the third phase.

If a detected error cannot be corrected, spare redundant sets 2 to 5 are loaded sequentially, and error detection and correction are carried out in the same manner. If an error cannot be corrected even by repeating the above steps until the last set 5 (the error cannot be corrected for all sets), processing terminates abnormally due to a boot error. The number of redundant sets may be arbitrarily set based on a target boot error prevention rate, and the set number may be notified to the boot-up controller 12 in advance. Alternatively, a code to identify the last set may be stored in the redundant sets to make the boot-up controller 12 automatically stop reloading based on this code. In addition, preparation of redundant sets in multiple erase blocks (e.g., 16K bytes) of the nonvolatile memory 38 allows further increase in the boot error prevention rate.

In a system using the multi-valued NAND nonvolatile memory 38 as boot ROM, the microprocessor boot-up controller, according to the first embodiment of the present invention, transfers NAND read data to the SRAM 24, and afterwards the host CPU accesses the SRAM 24 as boot ROM so as to boot up. A no-operation (IDLE) instruction (such as NOP) can be consecutively output as SRAM read data to the host CPU during a time from completion of loading data from the multi-valued NAND nonvolatile memory 38 into the SRAM 24 until the SRAM 24 enters a read ready state, resulting in the CPU effectively entering a wait state.

As described above, since the microprocessor boot-up controller, according to the first embodiment of the present invention, does not need to generate and provide a power-on reset signal for the boot-up controller 12 and the CPU independently, a microprocessor boot-up controller, which allows simplification of a power-on reset circuit, enabling the CPU to access the SRAM in the shortest time in sync with when a SRAM is ready, and reduction in the average system boot-up time, can be provided.

Second Embodiment

Figure 2:
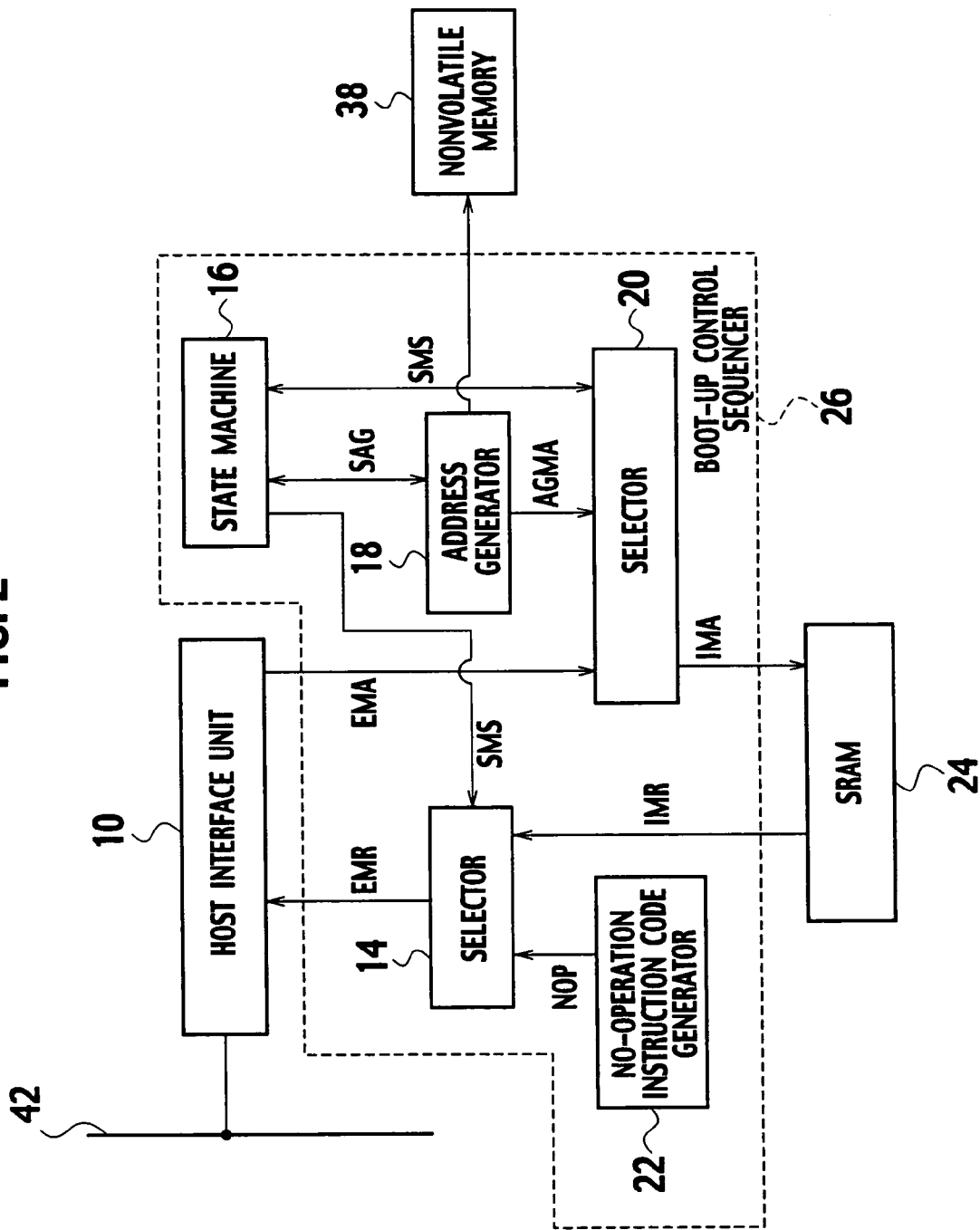
FIG. 2 is a schematic block diagram of a boot-up control sequencer, which comprises a multi-valued nonvolatile memory controller, according to a second embodiment of the present invention.

As shown in FIG. 2, a configuration of a nonvolatile memory controller 26, according to the second embodiment of the present invention, includes: an address generator 18 connected to an external nonvolatile memory 38, SRAM 24 or volatile memory, and a host interface unit 10. The address generator specifies an address in the nonvolatile memory 38. The controller further includes a first selector 20 connected to the address generator 18, receives an address generator memory address signal AGMA from the address generator 18, and provides an internal memory address signal IMA to the SRAM 24; a second selector 14 receives an internal memory read data signal IMR from the SRAM 24 and provides an external memory read data signal EMR to the host interface unit 10; a state machine 16, which provides an internal control signal SMS to the second selector 14 and the first selector 20 and provides an internal control signal SAG to the address generator 18; and a no-operation instruction code generator 22, which generates a no-operation instruction signal NOP to the second selector 14.

Alternatively, the nonvolatile memory controller 26 may further include nonvolatile memory 38 in which pieces of data retained in respective cells are assigned to consecutive page addresses, and may be structured such that the same data is written in an even and an odd page at consecutive addresses in the nonvolatile memory 38, and only either one of those pages is accessed.

In addition, the multi-valued NAND nonvolatile memory 38 may store data that is required to be reliable, such as boot-up instruction codes or parameters required for booting up a system.

As shown in FIG. 3, the multi-valued NAND nonvolatile memory 38 used by the nonvolatile memory controller or boot-up control sequencer 26, according to the second embodiment, includes six pages (0) to (5) in a NAND page address map, each being 512 bytes, for example. A boot code set is stored in page 1, and a copy thereof is stored in page 2. The boot-up controller 12 loads page 0 into the SRAM 24, while an error detection and correction unit 40 error checks page 0. If no errors are detected, loading is completed; otherwise, if an error is detected, processing terminates abnormally.

Figure 4:
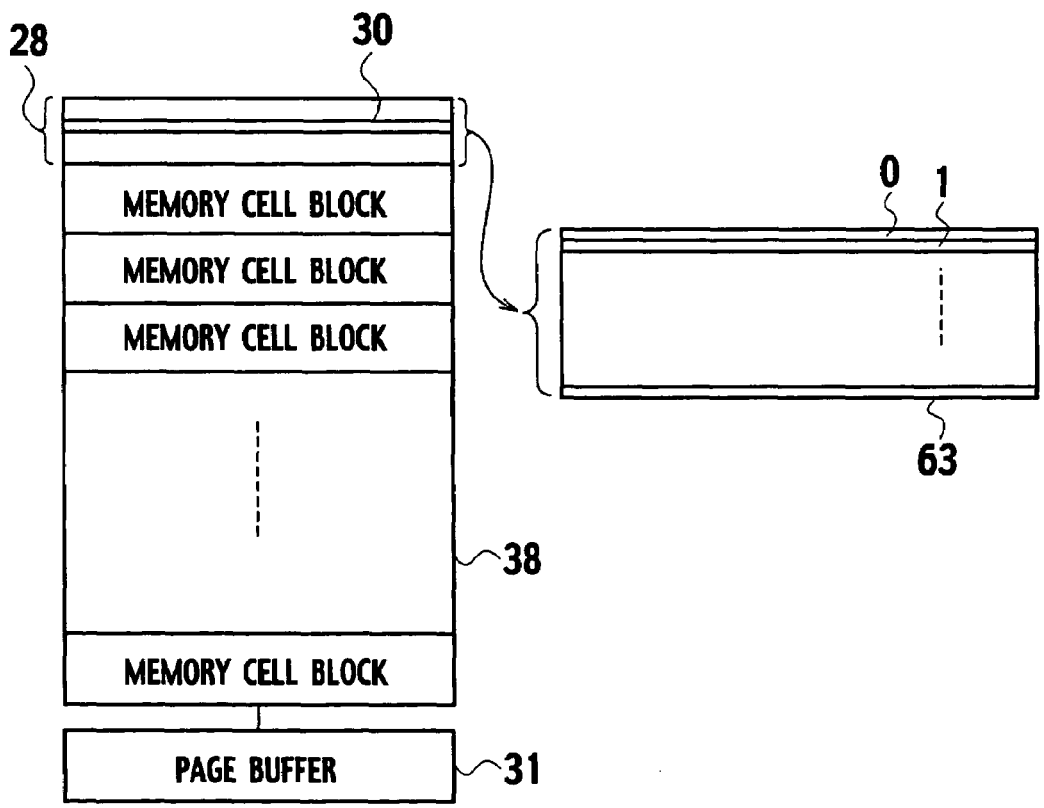
FIG. 4 is a schematic diagram describing a configuration of page units and memory cell blocks in the multi-valued NAND nonvolatile memory used for the second embodiment of the present invention.

As shown in FIG. 4, the multi-valued NAND nonvolatile memory 38, according to the second embodiment of the present invention, includes multiple memory cell blocks 28, each including a page unit 30 configured from, for example, 0 to 63 pages. In addition, the multi-valued NAND nonvolatile memory 38 includes a page buffer 31 used to input/output data. The page buffer has a storage capacity of 528 bytes (512 bytes+16 bytes). The page buffer contributes to inputting and outputting, data page by page, when writing data in; wherein one page corresponds to its own storage capacity. Here, 'page' is a unit in which writing in or reading out data is possible by inputting/outputting data from/to the page buffer.

In the multi-valued NAND nonvolatile memory 38, each memory cell has (N-th power of 2) threshold voltages (where N is an integer of 2 or more). In other words, each memory cell may store N-bit information. In the following, for convenience of description, a case of each memory cell having four threshold voltages is described. The address generator 18 shown in FIG. 2 may be used as an address generating circuit for the page unit 30.

Figure 5:
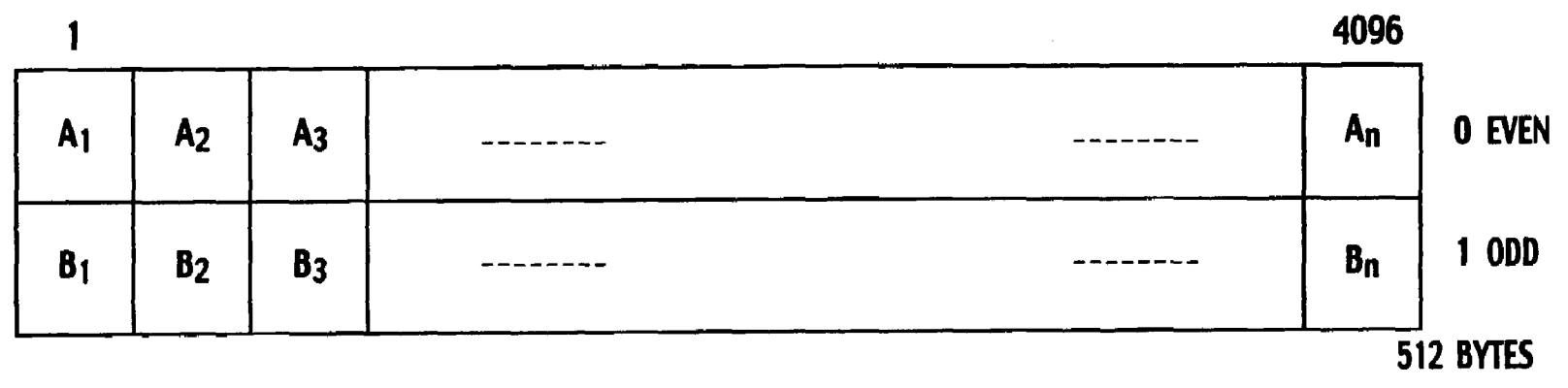

As shown in FIG. 5, odd and even pages in the multi-valued NAND nonvolatile memory 38 used for the second embodiment of the present invention are shown as consecutive pages. For example, an even page (0) and an odd page (1), each having 1 to 4096 bits or 512 bytes, are shown as consecutive pages.

Figure 6:
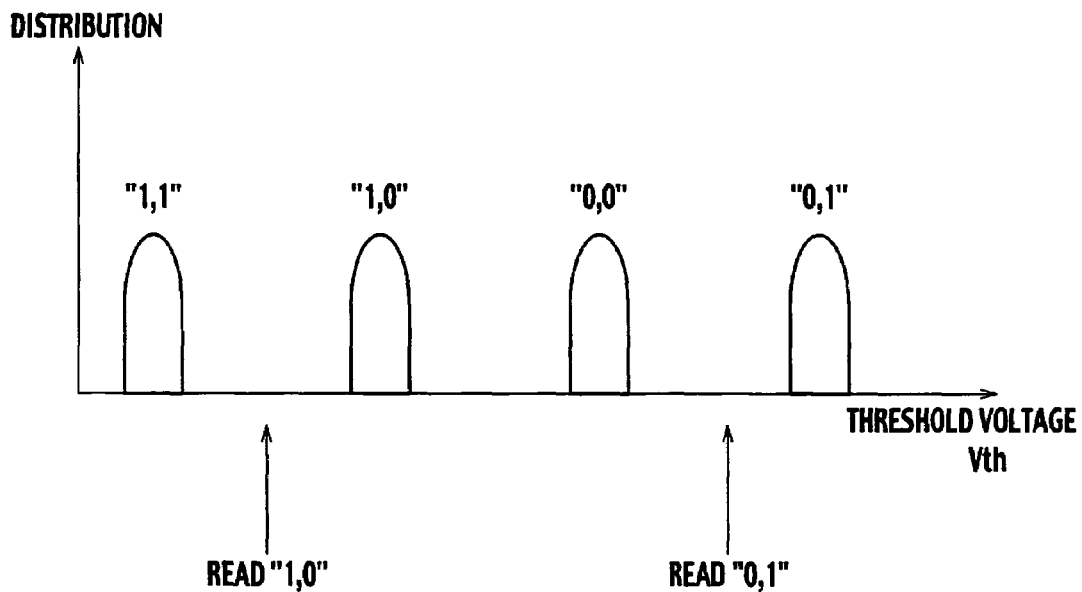
FIG. 6 is a schematic diagram describing an example of threshold voltage distribution of a four-valued NAND cell in the multi-valued NAND nonvolatile memory used for the second embodiment of the present invention.

As shown in FIG. 6, in a distribution of threshold voltages for retained data in a four-valued NAND cell in the multi-valued NAND nonvolatile memory used for the second embodiment of the present invention, the lower bit in 2-bit data is assigned to 1-bit data in a logically even page when seen from the outside of the NAND devices, and the upper bit therein is assigned to 1-bit data in an odd page.

Since the same data is written in an even and an odd page, a cell threshold voltage distribution is only for '11' and '00' out of four groups: '11', '10', '00', and '01'.

In a read-out operation, to begin with, a threshold voltage READ '1, 0' is used as a reference to identify retained data. If the retained data is determined as lower than that threshold voltage, it is then determined as '11', and this determination processing is then completed. On the other hand, if the retained data is determined as higher than that threshold voltage, it is then determined, based on a threshold voltage READ '0, 1', whether or not the retained data is lower than that threshold voltage. Logically, the second determination results should say that it is lower. Physically, it is impossible for the retained data to change to be higher due to age deterioration of the circuitry. This is because the threshold voltage cannot shift toward a higher level unless electric charges are injected to the floating gate of each memory cell from the outside of the memory cell. This characteristic considerably reduces the amount of read-out data errors due to age deterioration, such as electric charge loss in the multi-valued NAND nonvolatile memory 38.

According to the embodiment described above, '1, 1', '1, 0', '0, 0', and '0, 1' are assigned in order of decreasing threshold voltage of the memory cell. However, since this assignment depends on how the device is implemented, an assignment such as '1, 1', '1, 0', '0, 1', and '0, 0' or '1, 1', '0, 0', '1, 0', and '0, 1' is alternatively possible. Accordingly, it is not always necessary to write the same pieces of data in contiguous even pages and contiguous odd pages. Alternatively, non-inverted pieces of data may be written in even pages while inverted pieces of data may be written in odd pages, thereby increasing reliability.

Note that sets 2 and 3 in the multi-valued NAND boot code stored page addresses of the multi-valued NAND nonvolatile memory in FIG. 3 are used as spare sets when an error is detected in set 1. As a result, the same data as that in page (0) is stored in pages (1) to (5) respectively.

The nonvolatile memory controller or boot-up control sequencer 26, according to the second embodiment of the present invention, uses multi-valued NAND nonvolatile memory in which retained data in cells is assigned to consecutive page addresses, writes the same data in an even and an odd page having consecutive page addresses, and accesses only either one of those pages. This resolves problems such as deterioration in data due to slight threshold voltage change because of age deterioration and a decrease in reliability, and implements a nearly error-free, highly reliable nonvolatile memory controller or boot-up control sequencer.

Third Embodiment

Figure 7:
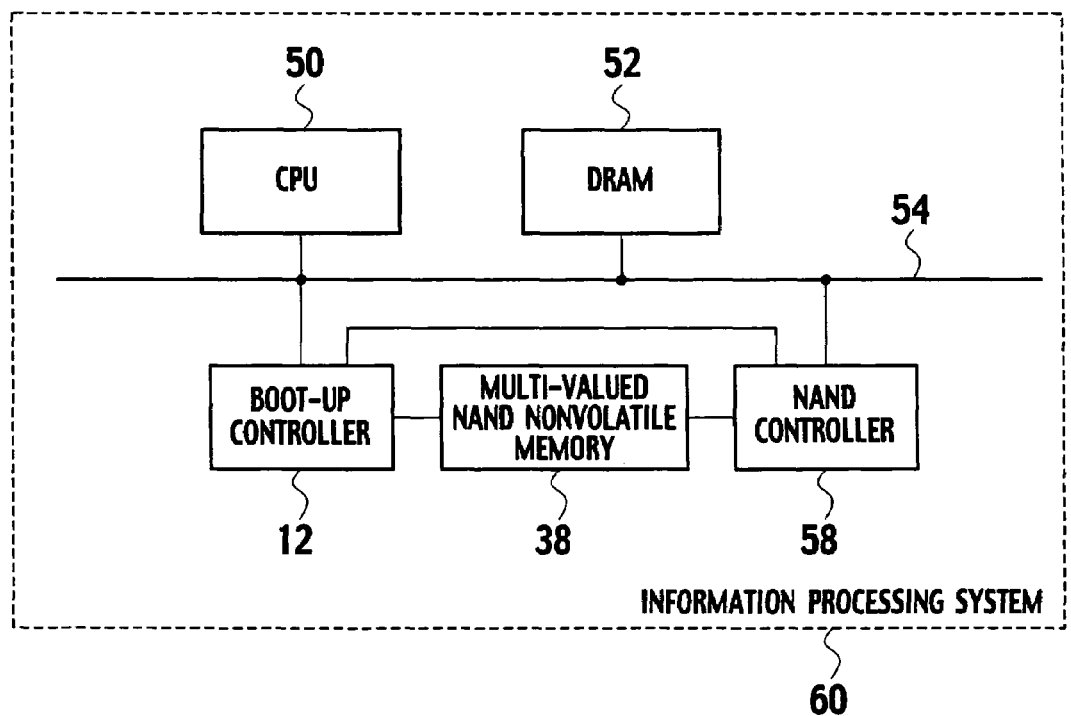
FIG. 7 is a schematic block diagram of an information processing system, according to a third embodiment of the present invention.

As shown in FIG. 7, a configuration of an information processing system 60, according to the third embodiment of the present invention, includes: multi-valued NAND nonvolatile memory 38 including multiple word lines and multiple memory cells, each having N threshold voltages (where N is a natural number greater than 2) and each connected to a corresponding one of the multiple word lines, and storing program codes and user data; a boot-up controller 12 connected to the multi-valued NAND nonvolatile memory 38 and includes SRAM 24 or volatile memory to which program codes are transferred from the multi-valued NAND nonvolatile memory 38; and a CPU 50 connected to the boot-up controller 12 and operates based on the program codes transferred to the SRAM 24. The multiple memory cells connected to the respective word lines constitute multiple pages, and program codes are stored in only some pages of those multiple pages.

The information processing system 60, according to the third embodiment of the present invention, may further include a NAND controller 58 connected to the multi-valued NAND nonvolatile memory 38 and controls the multi-valued NAND nonvolatile memory 38; a CPU bus 54 shared among the CPU 50, the boot-up controller 12, and the NAND controller 58; and DRAM 52 connected to the CPU bus 54.

In addition, the information processing system 60, according to the third embodiment of the present invention, includes an address generating circuit configured from an address generator 18 in the boot-up controller 12. A page is specified based on an address signal generated by the address generating circuit.

Furthermore, the multi-valued NAND nonvolatile memory 38 may be divided into two areas, either of which may use N values, and the other, N/2 values, and the program codes may use N/2 values. The value of N is an integer more than two.

In the case of using four-valued memory, the information processing system 60, according to the third embodiment of the present invention, includes: multi-valued NAND nonvolatile memory 38, which includes multiple word lines and multiple memory cells connected to the respective word lines, and which has four-valued memory with four threshold voltages; a boot-up controller 12, which includes SRAM 24 or volatile memory to which program codes are transferred from the multi-valued NAND nonvolatile memory 38 when booting up the system; and a CPU 50, which operates based on the program codes transferred to the SRAM 24. The multiple memory cells, which share one of the multiple word lines, constitute an odd and an even page, which can be specified by an address, and program codes are stored in either an odd or an even page.

The multi-valued NAND nonvolatile memory 38 may be divided into two areas, either of which may use four-valued, and the other, two-valued, and program codes may use two-valued. User data is stored in both an odd and an even page. In addition, the multi-valued NAND nonvolatile memory 38 and volatile memory 24 may be mounted in the same package.

Furthermore, the four-valued information processing system 60, according to the third embodiment of the present invention, includes an address generating circuit configured from an address generator 18 in the boot-up controller 12. Either an odd or an even page is addressed when booting up the system based on an address signal generated by the address generating circuit.

In addition, in the case of using four-valued memory, the information processing system 60, according to the third embodiment of the present invention, may be simply structured to include the multi-valued NAND nonvolatile memory 38 storing program codes; the boot-up controller 12, which includes the multi-valued NAND nonvolatile memory controller 26 that accesses only an even or an odd page in consecutive page address areas in the multi-valued NAND nonvolatile memory 38; the CPU bus 54, and the CPU 50 connected to the multi-valued NAND nonvolatile memory controller 26 via the CPU bus 54 and which is controlled to boot-up using the program codes. Such information processing system may be applied to a cellular terminal.

Figure 9:
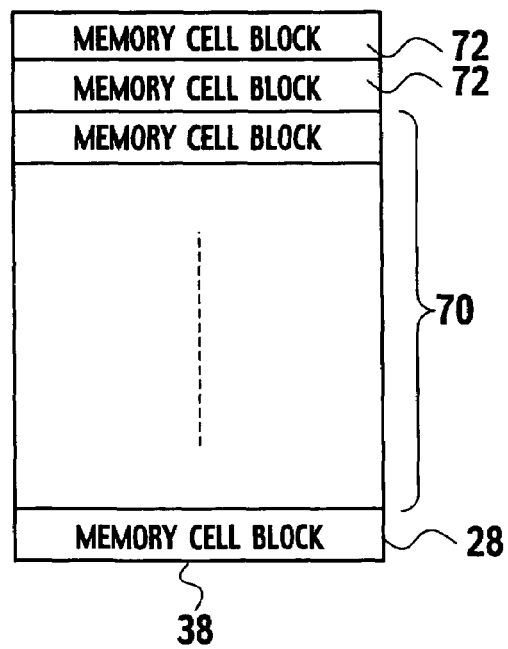
FIG. 9 is a schematic diagram describing a configuration including both boot code memory cell blocks and multi-valued memory storage blocks for multi-valued NAND nonvolatile memory used for the information processing system, according to the third and the fourth embodiment of the present invention.

In addition, as shown in FIG. 9, the multi-valued NAND nonvolatile memory 38 used for the information processing system, according to the third embodiment of the present invention, is configured from multiple memory blocks 28, for example, and includes boot code memory cell blocks 72 and multi-valued memory storage blocks 70. The multi-valued NAND nonvolatile memory 38 may be structured such that a physical memory space therein may be divided into a first and second area, and the second area is accessed by the nonvolatile memory controller 26. Programs used for booting up are stored in the second area, and user data such as image data and sound data is stored in the first area.

In the information processing system, according to the third embodiment of the present invention, the four-valued NAND nonvolatile memory 38 is divided into two areas, either of which uses four values, and the other, two values. This allows implementation of multifunctions for user applications. More specifically, N-valued NAND nonvolatile memory is divided into two areas, either of which uses N values, and the other, N/2 values. Highly significant data such as a program uses N/2 values, and user data, such as image data and sound data, uses N values to secure a large amount of accumulated information. This allows implementation of a multi-functional information processing system for user applications.

Fourth Embodiment

Figure 8:
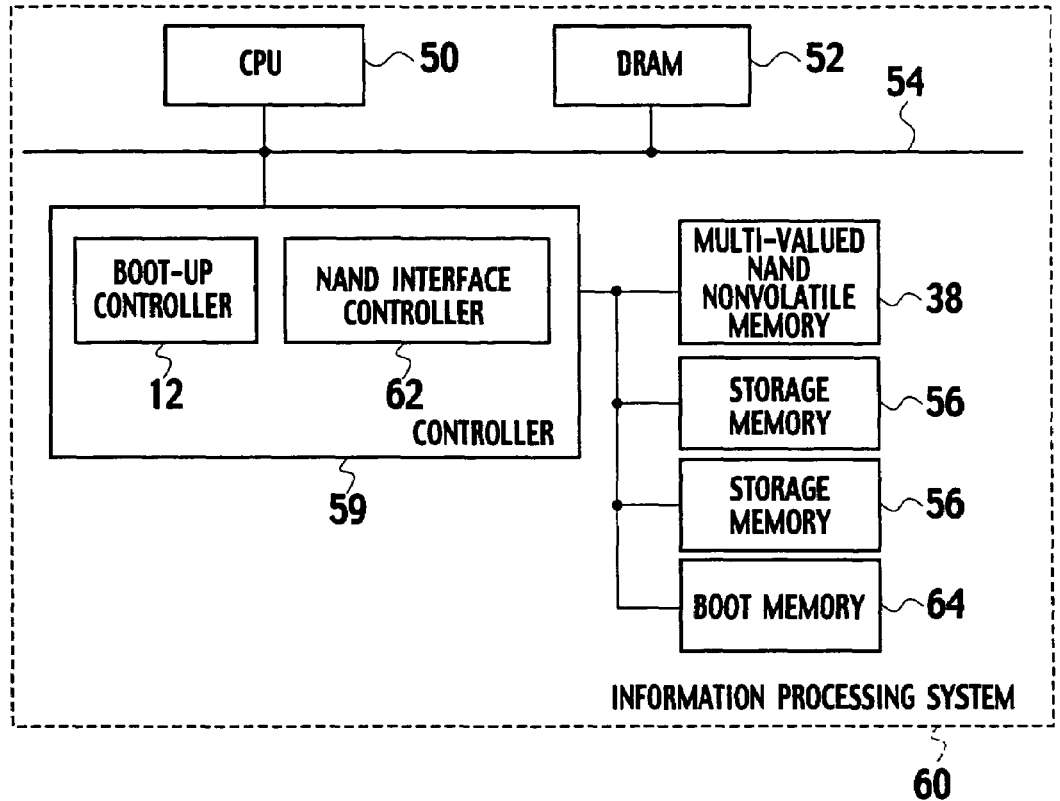
FIG. 8 is a schematic block diagram of an information processing system, according to a fourth embodiment of the present invention.

As shown in FIG. 8, an information processing system, according to the fourth embodiment of the present invention, includes: multi-valued NAND nonvolatile memory 38, further including multiple word lines and multiple memory cells, each having N threshold voltages (where N is a natural number greater than 2) and each connected to a corresponding one of the multiple word lines, and which is stored with program codes and user data; a controller 59 connected to the multi-valued NAND nonvolatile memory 38 and to which program codes are transferred from the multi-valued NAND nonvolatile memory 38; a CPU bus 54; and a CPU 50 connected to the controller 59 via the CPU bus 54 and operates based on the program codes.

The multiple memory cells connected to the respective word lines constitute multiple pages, and program codes are stored in only some pages out of the multiple pages.

In the information processing system, according to the fourth embodiment of the present invention, the controller 59 includes a boot-up controller 12, which includes SRAM 24 or volatile memory stored with program codes and a NAND interface controller 62.

The information processing system, according to the fourth embodiment of the present invention, further includes storage memory 56 and boot memory 64, which are connected to the multi-valued NAND nonvolatile memory 38 and the controller 59. In addition, DRAM 52 connected to the CPU bus 54 may further be included.

The multi-valued NAND nonvolatile memory 38, the storage memory 56, and the boot memory 64 may be configured on respective independent semiconductor chips. The simplest configuration is that they may be deployed on the same chip along with the multi-valued NAND nonvolatile memory 38. In this case, the multi-valued NAND nonvolatile memory 38 may be divided into multiple areas to be used as multi-valued NAND nonvolatile memory 38, storage-memory 56, and boot memory 64, respectively.

In the information processing system, according to the fourth embodiment of the present invention, the controller 59 may be a part other than the multi-valued NAND nonvolatile memory 38 in FIG. 1.

As shown in FIG. 9, the multi-valued NAND nonvolatile memory 38 used for the information processing system, according to the fourth embodiment of the present invention, is configured from multiple memory blocks 28, for example, and includes boot code memory cell blocks 72 and multi-valued memory storage blocks 70. The entire physical memory space of the multi-valued NAND nonvolatile memory 38 is 1 G bytes, for example, and may be divided into a first and a second area. The second area corresponds to the boot code memory cell blocks 72, and the first area corresponds to the multi-valued memory storage blocks 70. Needless to say, it is not necessary to divide the entire physical memory space of the multi-valued NAND nonvolatile memory 38 into the first and the second area. Alternatively, the physical memory space of the multi-valued NAND nonvolatile memory 38 may be used as only boot ROM.

The NAND interface controller 62 carries out block management and address conversion for the multi-valued NAND nonvolatile memory 38. The boot-up controller 12, the NAND interface controller 62, and the multi-valued NAND nonvolatile memory 38 may be deployed on the same chip.

Application examples of the information processing system 60 are, for example, a cellular terminal and a PDA. In other words, a cellular terminal and a PDA can be provided by preparing a RF circuit, a display, and a key input means in the information processing system 60. In addition, a design rule for the NAND nonvolatile memory 38 may be less than 0.1 µm, for example.

According to the information processing system of the fourth embodiment of the present invention, the multi-valued NAND nonvolatile memory 38 is divided into two areas or the first and the second area. The first area that is configured from the multi-valued memory storage blocks 70 is stored with general user data such as image data and sound data. The second area that is configured from the boot code memory cell blocks 72 is stored with a program used for booting up the information processing system 60. A multi-functional information processing system for user applications may be provided by the NAND interface controller 62 controlling the second area.

Fifth Embodiment

Figure 10:
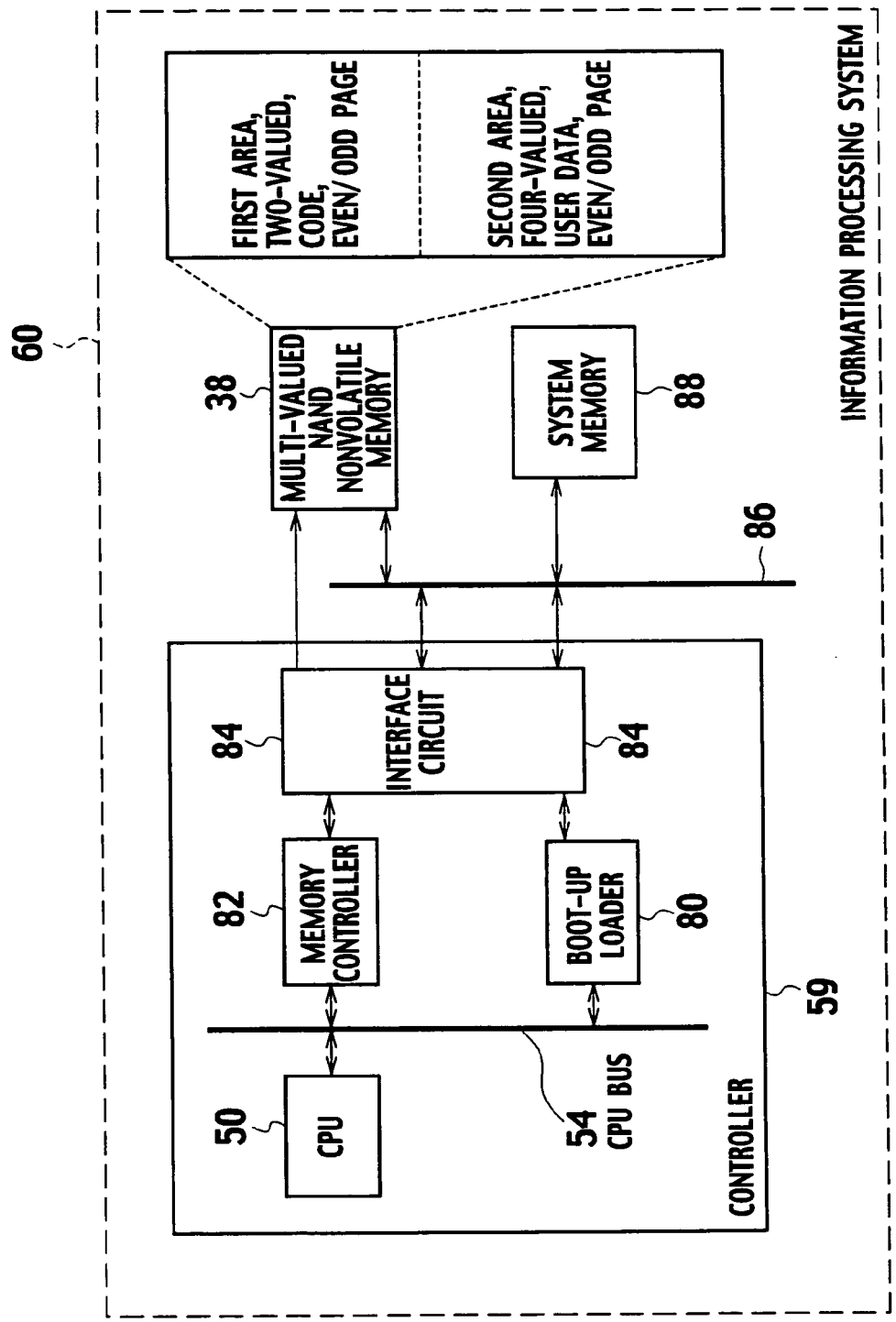
FIG. 10 is a schematic block diagram of an information processing system, according to a fifth embodiment of the present invention.

As shown in FIG. 10, an information processing system 60, according to the fifth embodiment of the present invention, includes: multi-valued NAND nonvolatile memory 38 further including multiple word lines and multiple memory cells, each having N threshold voltages (where N is a natural number greater than 2) and each connected to a corresponding one of the multiple word lines, and stores program codes and user data; a bus 86; a controller 59 connected to the multi-valued NAND nonvolatile memory 38 and to which program codes are transferred from the multi-valued NAND nonvolatile memory 38 via the bus 86; and system memory 88 connected to the bus 86.

The controller 59 includes a CPU 50, a memory controller 82, a boot-up loader 80, and an interface circuit 84 for the memory controller 82 and the boot-up loader 80, which are connected via a CPU bus 54. Here, the boot-up loader 80 functions as a controller to control boot codes in external ROM.

Various memory control signals, such as an inverted chip enable signal /CE, a clock enable signal CLE, an arithmetic operation signal ALE, an inverted write enable signal /WE, and an inverted read enable signal /RE, are provided to the multi-valued NAND nonvolatile memory 38 from the interface circuit 84.

As shown in FIG. 10, the multi-valued NAND nonvolatile memory 38 is divided into first and second areas. Binary codes may be stored in an even and an odd page in the first area while four-valued user data may be stored in an even and an odd page in the second area, as an example.

Figure 11:
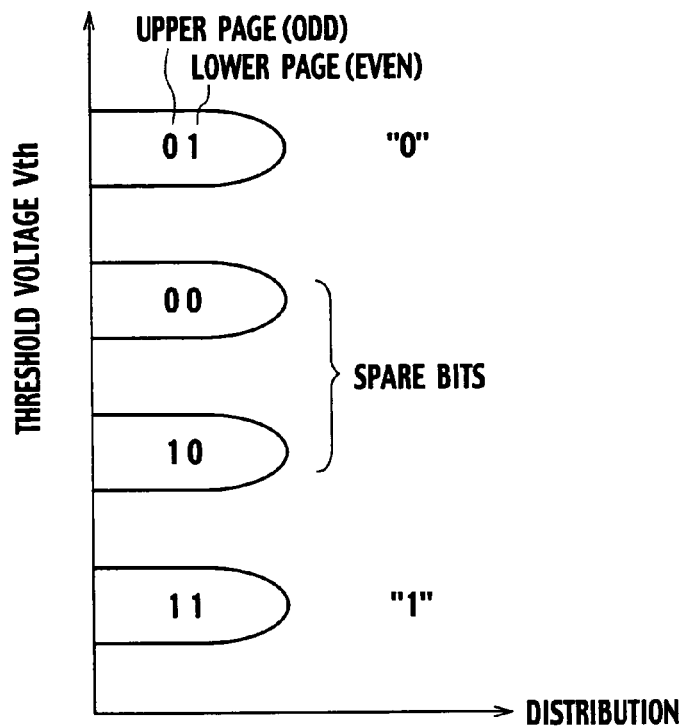
FIG. 11 is a schematic diagram describing an example of threshold voltage distribution of a four-valued NAND cell in a multi-valued NAND nonvolatile memory used for the fifth embodiment of the present invention.

As shown in FIG. 11, an exemplary operation of the multi-valued NAND nonvolatile memory 38 used for the information processing system 60, according to the fifth embodiment of the present invention, is to always write data '1' to the lower bits to which an even page is assigned, and store data in the upper bits to which an odd page is assigned. This operation allows use of four-valued memory cells as two-valued memory areas. Such configuration prevents a data error due to changes in threshold voltages.

Figure 12:
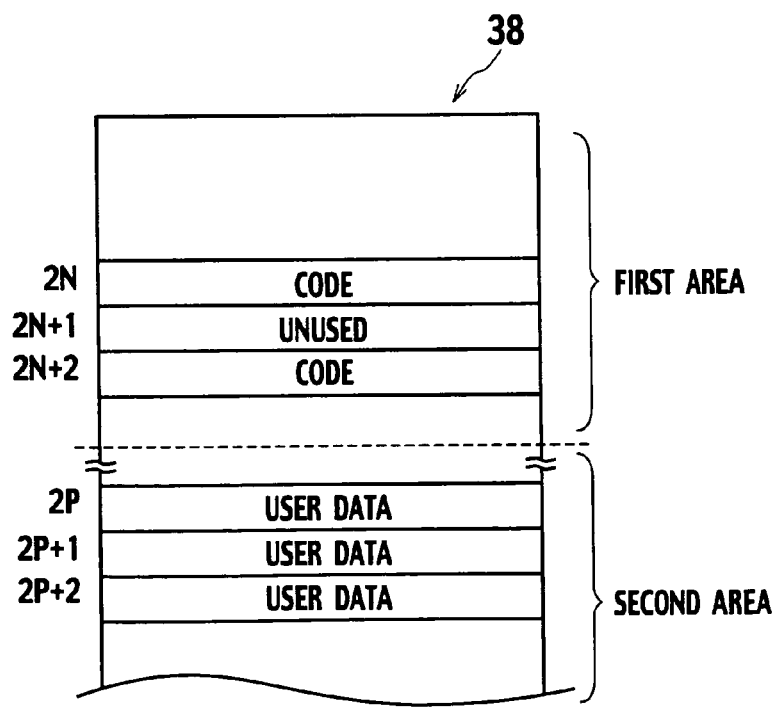
FIG. 12 is a detailed schematic diagram describing a configuration including an area 1 for storing binary code and an area 2 for storing four-valued user data in the multi-valued NAND nonvolatile memory used for the information processing system, according to the fifth embodiment of the present invention.

As shown in FIG. 12, the multi-valued NAND nonvolatile memory used for the information processing system, according to the fifth embodiment of the present invention, may be specifically configured by a first area for storing binary codes and a second area for storing four-valued user data. In the first area, odd pages are not used while even pages store code information as binary data. On the other hand, in the second area, four-valued data or user data is stored in both an even and an odd page.

As with the fourth embodiment, the information processing system, according to the fifth embodiment of the present invention, divides the multi-valued NAND nonvolatile memory 38 into the first and the second area. This allows implementation of a multi-functional information processing system for user applications. In addition, usage of even/odd pages with a threshold voltage distribution for storage of two-valued and four-valued data as shown in FIG. 11 prevents a data error due to changes in threshold voltages.

According to the embodiments described above, boot codes (program codes) have been stored in contiguous even pages and contiguous odd pages. However, the present invention is not limited to this, and highly reliable information, such as failure block information for NAND flash memory, a table used for translating a logical address in a system to a physical address in a NAND flash memory device, confidential management information for data stored in the NAND flash memory device, and error correction code information used for protecting data stored in the NAND flash memory device, may be stored alternatively.

Other Embodiments

As described above, the present invention is described according to the first through the fifth embodiment; however, it should not be perceived that descriptions forming part of this disclosure and the drawings are intended to limit the spirit and scope of the present invention. Various alternative embodiments, working examples, and operational techniques will become apparent from this disclosure for those skilled in the art.

In this manner, the present invention naturally includes various embodiments not described herein. Accordingly, the technical scope of the present invention is determined only by specified features of the invention according to appended claims that can be regarded appropriate from the above-mentioned descriptions.

Various modifications will become possible for those skilled in the art after receiving the teachings of the present disclosure without departing from the scope thereof.

What is claimed is:

1. A microprocessor boot-up controller connected to a CPU and a nonvolatile semiconductor memory and which reads data from the nonvolatile memory and controls boot-up of the CPU; the microprocessor boot-up controller comprising:
   a volatile memory connected to the nonvolatile memory and to which a boot-up program code is transferred from the nonvolatile memory;
   a boot-up control sequencer configured to transmit CPU read-in data to the CPU, so as to bring the CPU into a wait state until transfer of the boot-up program code is completed; and
   an error correction circuit configured to detect whether there is an error in the boot-up program code to be transferred to the volatile memory from the nonvolatile memory and to correct an error when an error is detected,
   wherein, the nonvolatile memory stores a plurality of the same boot-up program code sets, and the boot-up control sequencer transfers one set selected from the plurality of boot-up program code sets to the volatile memory, and when an error detected in the transferred set cannot be corrected by the error correction circuit, another set is selected one after another from the plurality of boot-up program code sets and transferred to the volatile memory.

2. The microprocessor boot-up controller of claim 1, wherein the CPU read-in data can be determined regardless of CPU output address.

* * * * *